US012588177B2

(12) United States Patent
Fujioka

(10) Patent No.: US 12,588,177 B2
(45) Date of Patent: Mar. 24, 2026

(54) WIRE HARNESS

(71) Applicant: SUMITOMO WIRING SYSTEMS, LTD., Yokkaichi (JP)

(72) Inventor: Ryo Fujioka, Yokkaichi (JP)

(73) Assignee: SUMITOMO WIRING SYSTEMS, LTD., Mie (JP)

( * ) Notice: Subject to any disclaimer, the term of this patent is extended or adjusted under 35 U.S.C. 154(b) by 181 days.

(21) Appl. No.: 18/369,948

(22) Filed: Sep. 19, 2023

(65) Prior Publication Data

US 2024/0121930 A1 Apr. 11, 2024

(30) Foreign Application Priority Data

Oct. 5, 2022 (JP) ................................. 2022-160976

(51) Int. Cl.
*H05K 9/00* (2006.01)
*B60R 16/02* (2006.01)
*H02G 3/04* (2006.01)

(52) U.S. Cl.
CPC ....... *H05K 9/0098* (2013.01); *B60R 16/0215* (2013.01); *H02G 3/0481* (2013.01)

(58) Field of Classification Search
CPC ................ H05K 9/0098; H05K 9/0018; B60R 16/0215; H02G 3/0481; H02G 3/0462; H01B 7/2806; H01B 7/282; H01B 7/17
See application file for complete search history.

(56) References Cited

U.S. PATENT DOCUMENTS

| | | | |
|---|---|---|---|
| 2015/0287497 A1* | 10/2015 | Shiga | B60R 16/0215 174/84 R |
| 2016/0126709 A1* | 5/2016 | Maeda | B60R 16/0215 174/68.3 |
| 2018/0174709 A1* | 6/2018 | Hagi | B60L 15/00 |
| 2020/0156566 A1* | 5/2020 | Shimizu | H01R 13/6592 |
| 2024/0363265 A1* | 10/2024 | Hirooka | H01B 7/0045 |

FOREIGN PATENT DOCUMENTS

JP 2007-280814 A 10/2007

* cited by examiner

*Primary Examiner* — Paresh Paghadal
(74) *Attorney, Agent, or Firm* — Oliff PLC

(57) ABSTRACT

A wire harness including: an electric wire; a conductive cylindrical tube through which the electric wire penetrates; a cylindrical electromagnetic shield that surrounds an outer circumference of the electric wire and is fixed to an end of the cylindrical tube; an annular fixing member that fixes the electromagnetic shield to the end of the cylindrical tube; and an oxidation suppression layer that seals a fixed portion of the cylindrical tube and the electromagnetic shield fixed by the fixing member.

8 Claims, 8 Drawing Sheets

WIRE HARNESS

BACKGROUND

The present disclosure relates to a wire harness.

Conventionally, in wire harnesses used in hybrid automobiles or electric automobiles, the outer circumference of an electric wire is shielded by an electromagnetic shield member to block electromagnetic waves (electromagnetic noise) generated accompanying current flowing to the electric wire (for example, see JP 2007-280814A). As the electromagnetic shield member, for example, a braided member in which conductive elemental wires are braided in a cylindrical shape, metallic foil, or the like is used. In this kind of wire harness, an end portion of the electromagnetic shield member in an axial direction is fixed to a conductive cylindrical member by a fixing member such as a swage ring. Accordingly, the electromagnetic shield member and the cylindrical member are electrically connected.

SUMMARY

The above-described wire harness is repeatedly heated and cooled in the air, and the electromagnetic shield member is likely to be oxidized. As the oxidation of the electromagnetic shield member proceeds, the electric resistance value of the electrical connection portion between the electromagnetic shield member and the cylindrical member increases. As a result, a problem arises in that the electromagnetic shield performance decreases.

An exemplary aspect of the disclosure provides a wire harness that is capable of suppressing a decrease in electromagnetic shield performance.

A wire harness according to the present disclosure includes: an electric wire; a conductive cylindrical tube through which the electric wire penetrates; a cylindrical electromagnetic shield that surrounds an outer circumference of the electric wire and is fixed to an end of the cylindrical tube; an annular fixing member that fixes the electromagnetic shield to the end of the cylindrical tube; and an oxidation suppression layer that seals a fixed portion of the cylindrical tube and the electromagnetic shield fixed by the fixing member.

The wire harness according to the present disclosure achieves the advantageous effect of suppressing a decrease in electromagnetic shield performance.

DETAILED DESCRIPTION OF EMBODIMENTS

Description of Embodiments of Present Disclosure

Figure 1:
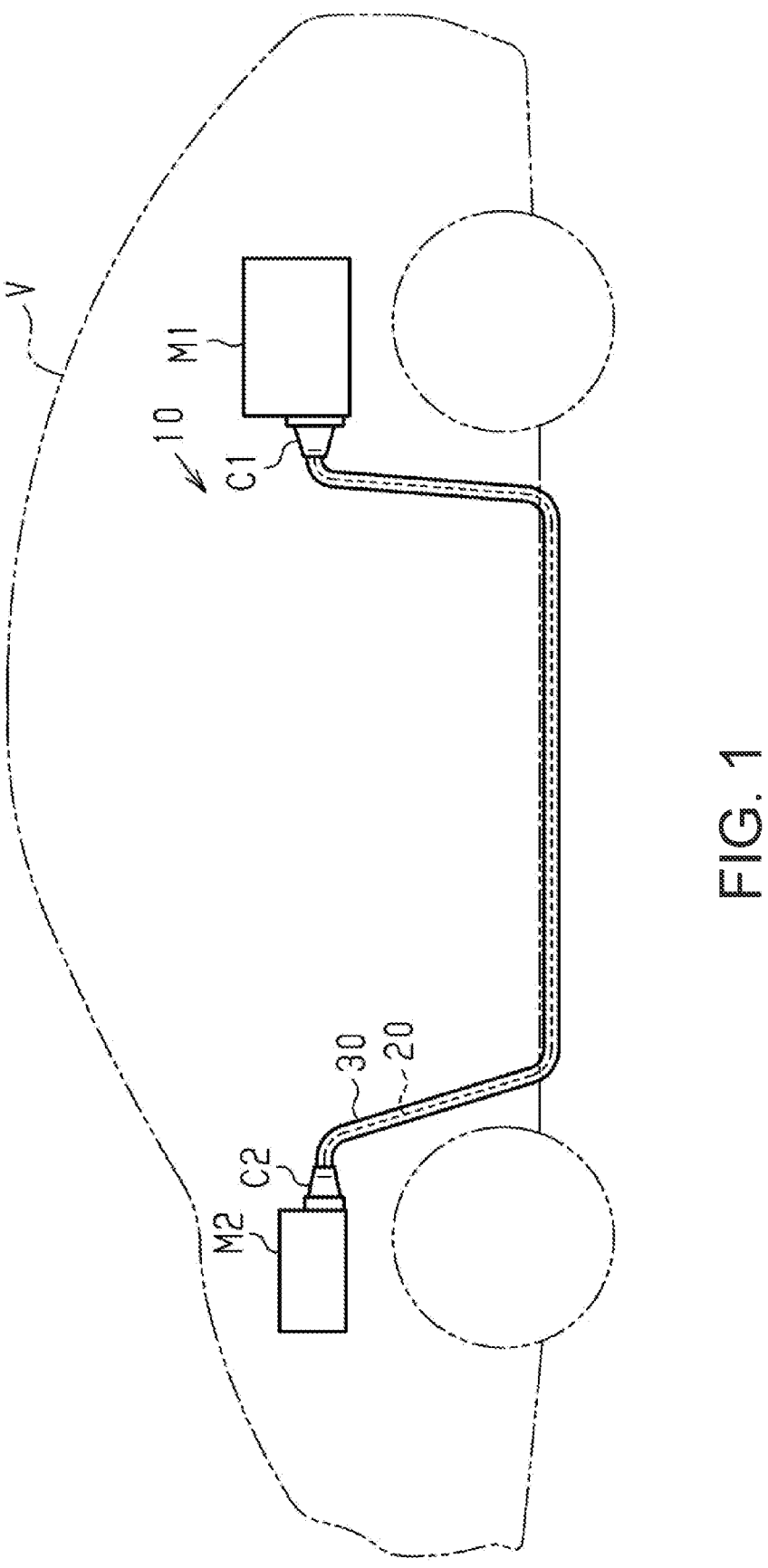
FIG. 1 is a schematic configuration diagram showing a wire harness in an embodiment.

First, embodiments of the present disclosure will be listed and described.

[1] A wire harness according to the present disclosure includes: an electric wire; a conductive cylindrical member through which the electric wire penetrates; a cylindrical electromagnetic shield member that surrounds an outer circumference of the electric wire and is fixed to an end portion of the cylindrical member; an annular fixing member that fixes the electromagnetic shield member to the end portion of the cylindrical member; and an oxidation suppression layer that seals a fixed portion of the cylindrical member and the electromagnetic shield member fixed by the fixing member.

With this configuration, the fixed portion of the cylindrical member and the electromagnetic shield member fixed by the fixing member is sealed by the oxidation suppression layer. Accordingly, it is possible to suppress the cylindrical member and the electromagnetic shield member at the fixed portion from coming into contact with air, and it is possible to suppress oxidation of the cylindrical member and the electromagnetic shield member at the fixed portion. As a result, it is possible to suppress an increase in the electric resistance value of the electrical connection portion between the cylindrical member and the electromagnetic shield member, and it is possible to suppress a decrease in the electromagnetic shield performance of the wire harness.

The term "cylindrical" used herein refers to not only the shape of an object with a circumferential wall continuously formed over the entire circumference in the circumferential direction thereof, but also the cylindrical shape of an object formed by combining a plurality of components and the shape of an object with a partial cutout in the circumferential direction thereof, such as a C shape. A "cylindrical" shape includes, but is not limited to, a circular shape, an oval shape, and a polygonal shape with sharpened or round corners. The term "annular" used herein may refer to any structure forming a loop, an endless continuous shape, or a generally loop-shaped structure with a gap, such as a C shape. An "annular" shape includes, but is not limited to, a circular shape, an oval shape, or a polygonal shape with sharpened or round corners.

[2] In [1] above, the oxidation suppression layer may continuously cover an outer circumferential surface of the fixing member, a side surface of the fixing member, an outer circumferential surface of the electromagnetic shield member exposed from the fixing member, and an outer circumferential surface of the cylindrical member exposed from the electromagnetic shield member. The oxidation suppression layer may cover the entire outer circumferential surface of the fixing member in a circumferential direction thereof. The oxidation suppression layer may cover the entire outer circumferential surface of the electromagnetic shield member in a circumferential direction thereof. The oxidation suppression layer may cover the entire outer circumferential surface of the cylindrical member in a circumferential direction thereof.

With this configuration, the oxidation suppression layer is formed so as to extend over the fixing member, the electromagnetic shield member, and the cylindrical member and so as to continuously cover the outer circumferential surface of the fixing member, the outer circumferential surface of the electromagnetic shield member, and the outer circumferential surface of the cylindrical member. Accordingly, it is possible to preferably suppress the cylindrical member and the electromagnetic shield member at the fixed portion from coming into contact with air, and it is possible to preferably suppress oxidation of the cylindrical member and the electromagnetic shield member at the fixed portion. As a result, it is possible to suppress an increase in the electric resistance value of the electrically connected portion between the cylindrical member and the electromagnetic shield member, and it is possible to suppress a decrease in the electromagnetic shield performance of the wire harness.

[3] In [1] or [2] above, the oxidation suppression layer may have a heat resistance of 120° C. or higher. With this configuration, the oxidation suppression layer has a heat resistance of 120° C. or higher. Accordingly, even if the wire harness is subjected to a high-temperature environment of about 100° C. to 115° C. in a heat cycle test or the like, it is possible to preferably suppress deterioration of the oxidation suppression layer. For example, even if the wire harness is subjected to a high-temperature environment, it is possible to preferably suppress deformation and melting of the oxidation suppression layer. Accordingly, even if the wire harness is subjected to a high-temperature environment, the state of the fixed portion sealed by the oxidation suppression layer can be maintained, and therefore it is possible to preferably suppress oxidation of the cylindrical member and the electromagnetic shield member at the fixed portion.

[4] In [3] above, the oxidation suppression layer may be made of a silicone sealing material. With this configuration, the oxidation suppression layer is made of a silicone sealing material with excellent heat resistance. Accordingly, if the wire harness is subjected to a high-temperature environment, it is possible to preferably suppress the deformation or melting of the oxidation suppression layer.

[5] In any one of [1] to [4] above, the electromagnetic shield member may be a braided member that is formed by braiding a plurality of conductive elemental wires and has a mesh. The oxidation suppression layer may cover the entire inner circumferential surface of the fixing member. The oxidation suppression layer may fill the mesh of the electromagnetic shield member at a portion in contact with the inner circumferential surface of the fixing member.

With this configuration, the oxidation suppression layer is formed so as to cover the entire inner circumferential surface of the fixing member and fill the mesh of the electromagnetic shield member at the portion in contact with the inner circumferential surface of the fixing member. Accordingly, it is possible to form the oxidation suppression layer so as to fill a gap between the inner circumferential surface of the fixing member and the outer circumferential surface of the cylindrical member. Therefore, it is possible to suppress intrusion of foreign matter into the gap between the inner circumferential surface of the fixing member and the outer circumferential surface of the cylindrical member, and it is possible to suppress occurrence of an unintended product in the gap between the inner circumferential surface of the fixing member and the outer circumferential surface of the cylindrical member. Therefore, it is possible to preferably suppress an increase in the electric resistance value of the electrically connected portion between the cylindrical member and the electromagnetic shield member due to foreign matter or unintended product, and it is possible to preferably suppress a decrease in the electromagnetic shield performance of the wire harness.

[6] According to any of [1] to [5], the oxidation suppression layer may extend along the axial direction of the cylindrical member, and the outer circumferential dimension of the oxidation suppression layer may be constant over the entire length of the oxidation suppression layer in a lengthwise direction.

On the outer circumferential surface of the fixed portion at which the electromagnetic shield member is fixed to the outer circumferential surface of the cylindrical member by the fixing member, a first step portion is formed by the outer circumferential surface of the fixing member, the side surface of the fixing member, and the outer circumferential surface of the electromagnetic shield member. In contrast to this, in the above-described configuration, the outer circumferential dimension of the oxidation suppression layer is constant over the entire length of the oxidation suppression layer in the lengthwise direction. This eliminates a step corresponding to the first step portion from the outer circumferential surface of the oxidation suppression layer.

The term "outer circumferential dimension of a member A" herein refers to the length of the member A around the outer circumferential surface along the circumferential direction of the member A. The term "inner circumferential dimension of a member A" refers to the length of the member A around the inner circumferential surface along the circumferential direction of the member A.

[7] In [6] above, the thickness of the oxidation suppression layer at the portion covering the outer circumferential surface of the electromagnetic shield member exposed from the fixing member may be larger than the thickness of the oxidation suppression layer at the portion covering the outer circumferential surface of the fixing member.

With this configuration, it is possible to form the oxidation suppression layer so as to have a large thickness at the portion that directly covers the outer circumferential surface of the electromagnetic shield member exposed from the fixing member. Accordingly, it is possible to improve the cushioning property of the oxidation suppression layer at the portion that directly covers the outer circumferential surface of the electromagnetic shield member exposed from the fixing member, and it is possible to improve the protection performance of the oxidation suppression layer at that portion.

[8] In [6] or [7] above, a cylindrical waterproof member surrounding the outer circumference of the oxidation suppression layer may be further included. The waterproof member may have a cylindrical main body portion that surrounds the entire outer circumference of the oxidation suppression layer in a circumferential direction thereof and a first cylindrical connection portion that is formed continuously in one piece with the cylindrical main body portion and is connected to the outer circumferential surface of the cylindrical member. The inner circumferential dimension of the cylindrical main body portion may be greater than or equal to the outer circumferential dimension of the oxidation suppression layer. The inner circumferential dimension of the first cylindrical connection portion may be smaller than the outer circumferential dimension of the oxidation suppression layer.

With this configuration, the inner circumferential dimension of the cylindrical main body portion is set so as to be greater than or equal to the outer circumferential dimension of the oxidation suppression layer, and the inner circumferential dimension of the first cylindrical connection portion is set so as to be smaller than the outer circumferential dimension of the oxidation suppression layer. Accordingly, in the axial direction of the waterproof member, the oxidation suppression layer and the first cylindrical connection portion can engage with each other. Therefore, when attaching the waterproof member to the cylindrical member and the oxidation suppression layer, the waterproof member can be easily positioned with respect to the oxidation suppression layer.

[9] According to any of [1] to [5], the outer circumferential surface of the oxidation suppression layer may be formed in a stepped shape along a first step portion that is formed by the outer circumferential surface of the fixing member, the side surface of the fixing member, and the outer circumferential surface of the electromagnetic shield member, and along a second step portion that is formed by the outer circumferential surface of the electromagnetic shield member and the outer circumferential surface of the cylindrical member.

With this configuration, the outer circumferential surface of the oxidation suppression layer is formed in a stepped shape along the first step portion and the second step portion. This reduces the number of partially thickened portions of the oxidation suppression layer, as compared to the case where the outer circumferential surface of the oxidation suppression layer is formed in a non-stepped shape so as to absorb the steps resulting from the first step portion and the second step portion. Accordingly, the volume of the oxidation suppression layer can be reduced. This makes it possible to reduce the material cost of the oxidation suppression layer.

Details of Embodiments of Present Disclosure

A specific example of the wire harness of the present disclosure will be described below with reference to the drawings. The drawings may illustrate some of components in an exaggerated or simplified manner for the convenience of description. The dimensional proportions of the components may be different between drawings. The terms "parallel", "orthogonal", "entire length", and "entire circumference" herein mean not only strictly parallel, orthogonal, entire length, and entire circumference, but also substantially parallel, orthogonal, entire length, and entire circumference within a range in which the operations and effects of the present embodiment are exhibited. The terms "first", "second", and the like added to the names of components herein are descriptive indices used for distinguishing between the components, and are not intended to rank the components unless otherwise described. It should be noted that the present disclosure is not limited to the examples herein, but rather is indicated by the scope of the claims, and is intended to encompass all modifications within a meaning and scope equivalent to the scope of the claims.

Overall Configuration of Wire Harness 10

A wire harness 10 shown in FIG. 1 is mounted in a vehicle V such as a hybrid automobile or an electric automobile. The wire harness 10 electrically connects two or more in-vehicle devices. The in-vehicle devices are electric devices mounted in the vehicle V. The wire harness 10 electrically connects a high-voltage battery M1 that is installed at the rear portion of the vehicle V and an inverter M2 that is installed at the front portion of the vehicle V forward of the high-voltage battery M1. The high-voltage battery M1 is a battery that can supply a voltage of several hundred volts, for example. The inverter M2 is connected to a motor for driving wheels (not shown) that is a motive power source for vehicle traveling. The inverter M2 generates alternating-current power from direct-current power of the high-voltage battery M1, and supplies the alternating-current power to the motor. The wire harness 10 is formed in an elongated shape so as to extend in the front-rear direction of the vehicle V, for example.

The wire harness 10 includes one or more electric wires 20, connectors C1 and C2 attached to both end portions of the electric wires 20, and an electromagnetic shield component 30 that surrounds the outer circumference of the electric wires 20, for example. The wire harness 10 in the present embodiment includes two electric wires 20. A first end portion of each electric wire 20 in the lengthwise direction is connected to the high-voltage battery M1 via the connector C1, and a second end portion of each electric wire 20 in the lengthwise direction is connected to the inverter M2 via the connector C2.

Figure 2:
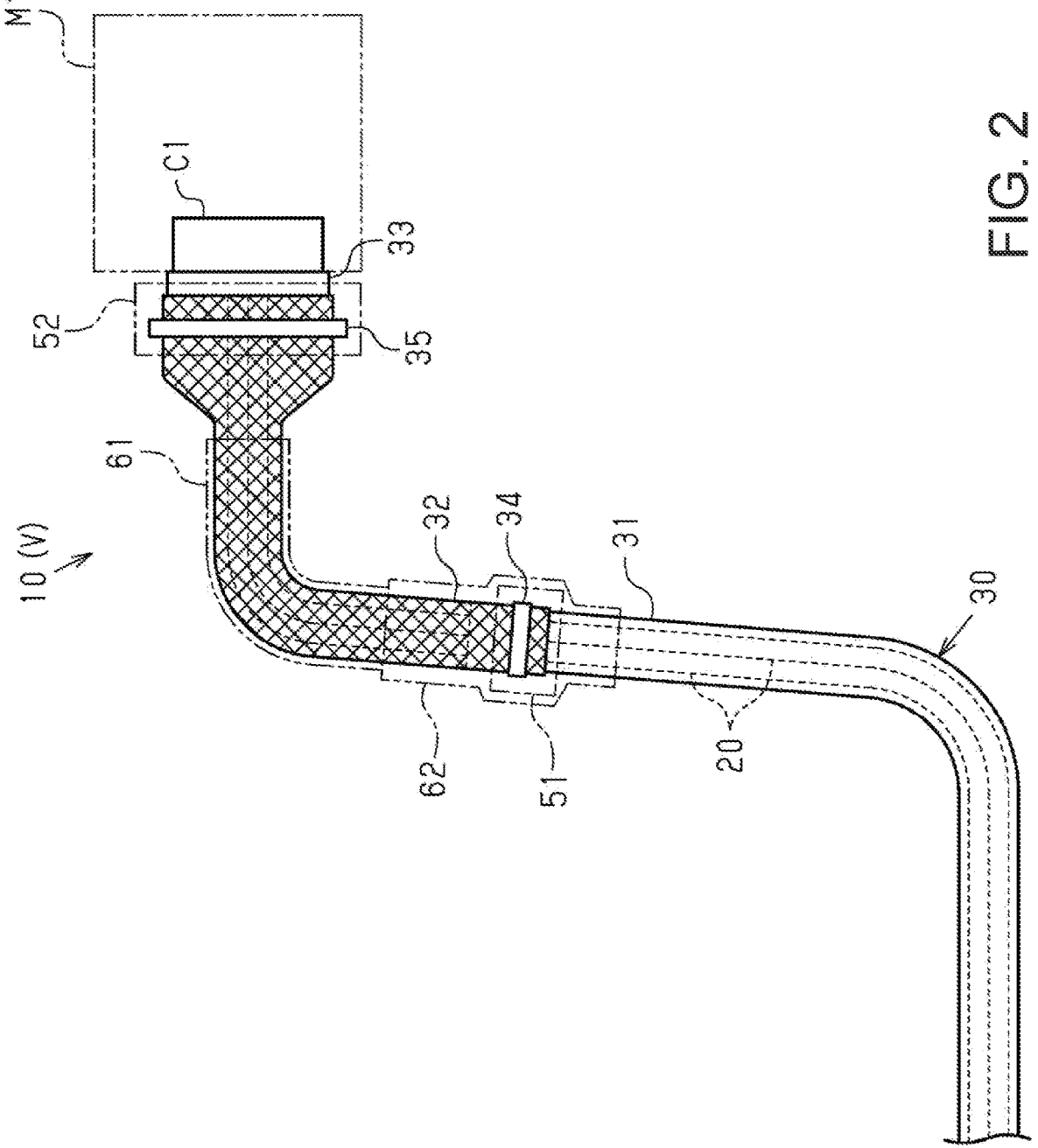
FIG. 2 is a schematic side view of the wire harness in the embodiment.

As shown in FIG. 2, the electromagnetic shield component 30 includes a cylindrical member 31 (conductive cylindrical tube) having conductivity, a cylindrical electromagnetic shield member 32 (electromagnetic shield) having conductivity, and a cylindrical shield shell 33 having conductivity. The electromagnetic shield component 30 includes a fixing member 34 that fixes the first end of the electromagnetic shield member 32 in the axial direction to the end portion of the cylindrical member 31 and a fixing member 35 that fixes the second end portion of the electromagnetic shield member 32 in the axial direction to the end portion of the shield shell 33, for example. The cylindrical member 31, the electromagnetic shield member 32, and the shield shell 33 constitute a series of cylindrical bodies that are electrically continuous with each other due to being coupled together by the fixing members 34 and 35. As the fixing members 34 and 35, swage rings, binding bands, or tape members may be used, for example. As the material of the swage rings, an iron-based, aluminum-based, or copper-based metallic material can be used, for example. The fixing members 34 and 35 in the present embodiment are swage rings. The material of the fixing members 34 and 35 may be a metallic material of the same kind as that of the electromagnetic shield member 32 or may be a metallic material of a kind different from that of the electromagnetic shield member 32. The material of the fixing members 34 and 35 in the present embodiment is stainless steel, which is a metallic material different from that of the electromagnetic shield member 32.

Figure 3:
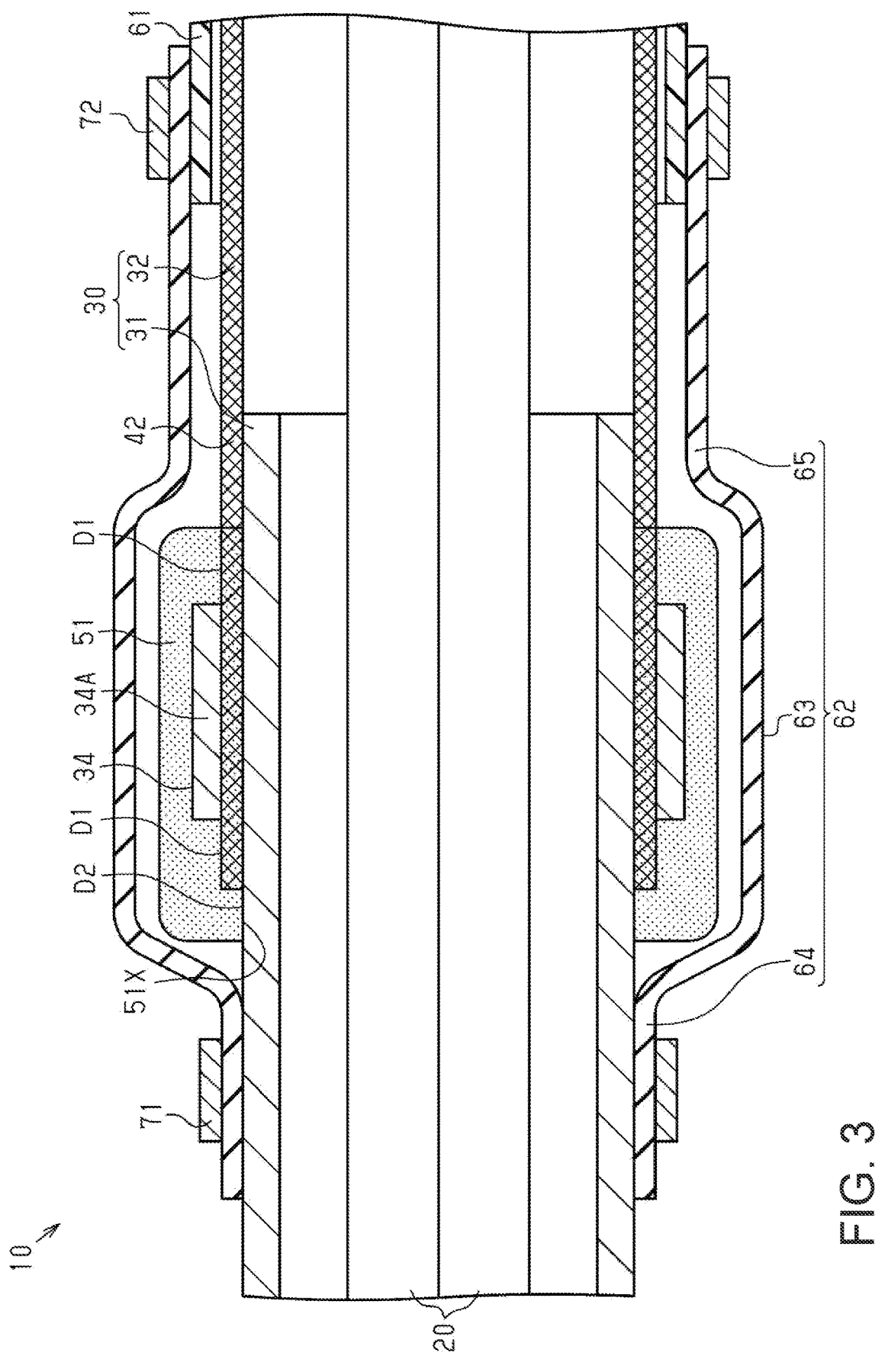
FIG. 3 is a schematic enlarged vertical cross-sectional view of a fixed portion of a cylindrical member and an electromagnetic shield member in the wire harness in the embodiment.
Figure 4:
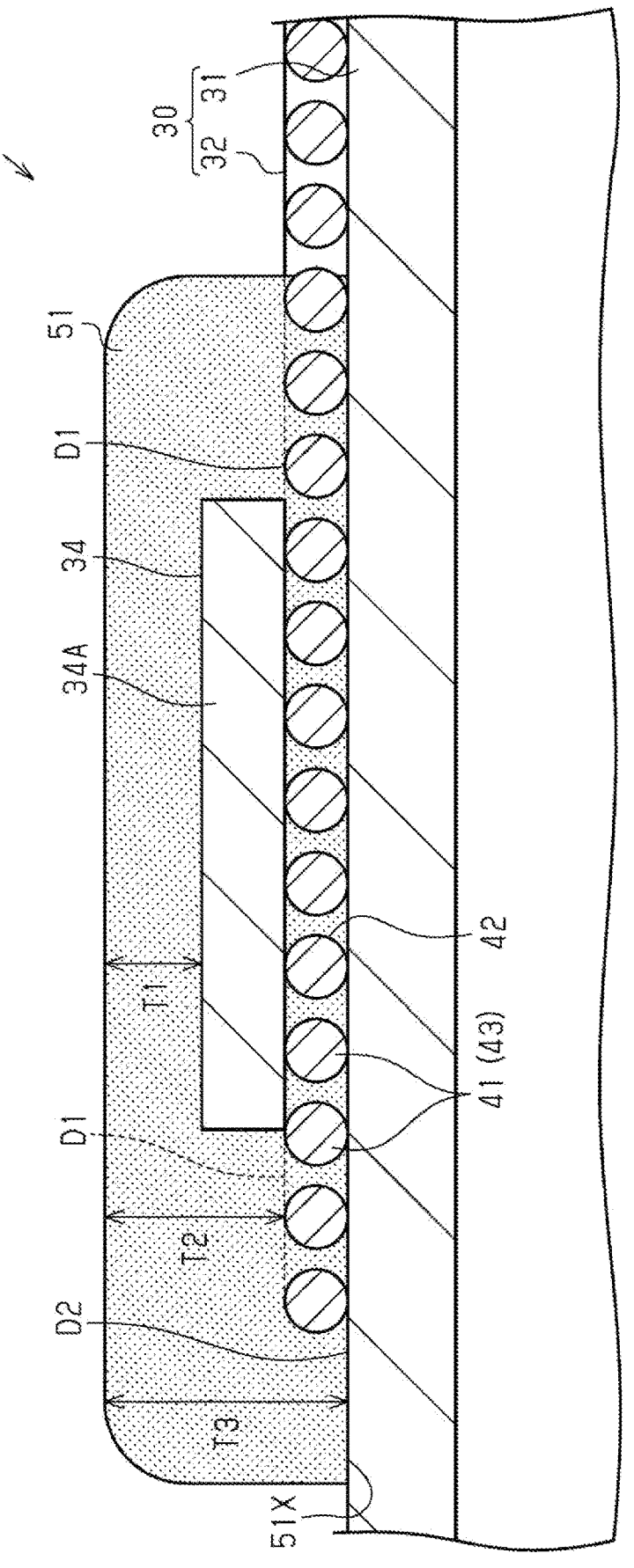
FIG. 4 is a schematic further enlarged vertical cross-sectional view of the fixed portion of the cylindrical member and the electromagnetic shield member in the wire harness in the embodiment.

As shown in FIGS. 2 to 4, the wire harness 10 includes an oxidation suppression layer 51 that covers the fixed portion of the cylindrical member 31 and the electromagnetic shield member 32 fixed by the fixing member 34. As shown in FIG. 2, the wire harness 10 includes an oxidation suppression layer 52 that covers the fixed portion of the shield shell 33 and the electromagnetic shield member 32 fixed by the fixing member 35. The oxidation suppression layers 51 and 52 have a heat resistance of 120° C. or higher, for example. The oxidation suppression layers 51 and 52 preferably have a heat resistance of 150° C. or higher, more preferably have heat resistance of 200° C. or higher, for example. As a material of the oxidation suppression layers 51 and 52, a curable material that is cured from a state with fluidity to a state without fluidity can be used, for example. As the curable material, a resin-based or rubber-based curable material can be used, for example. As the curable material, an adhesive, a sealing material, or a caulking material can be used, for example. As a material of the oxidation suppression layers 51 and 52, a silicone sealing material can be preferably used.

The wire harness 10 includes a cylindrical protective member 61 that surrounds the outer circumference of the electromagnetic shield member 32 and a cylindrical waterproof member 62 (cylindrical waterproof tube), for example. As shown in FIG. 3, the wire harness includes a fixing member 71 that fixes a first end portion of the waterproof member 62 in the axial direction to the cylindrical member 31 and a fixing member 72 that fixes a second end portion of the waterproof member 62 in the axial direction to the protective member 61, for example. As the fixing members 71 and 72, swage rings, binding bands, or tape members can be used, for example. The fixing members 71 and 72 in the present embodiment are binding bands.

Configuration of Electric Wires 20

Figure 5:
FIG. 5 is a schematic horizontal cross-sectional view of the fixed portion of the cylindrical member and the electromagnetic shield member in the wire harness in the embodiment.
Figure 6:
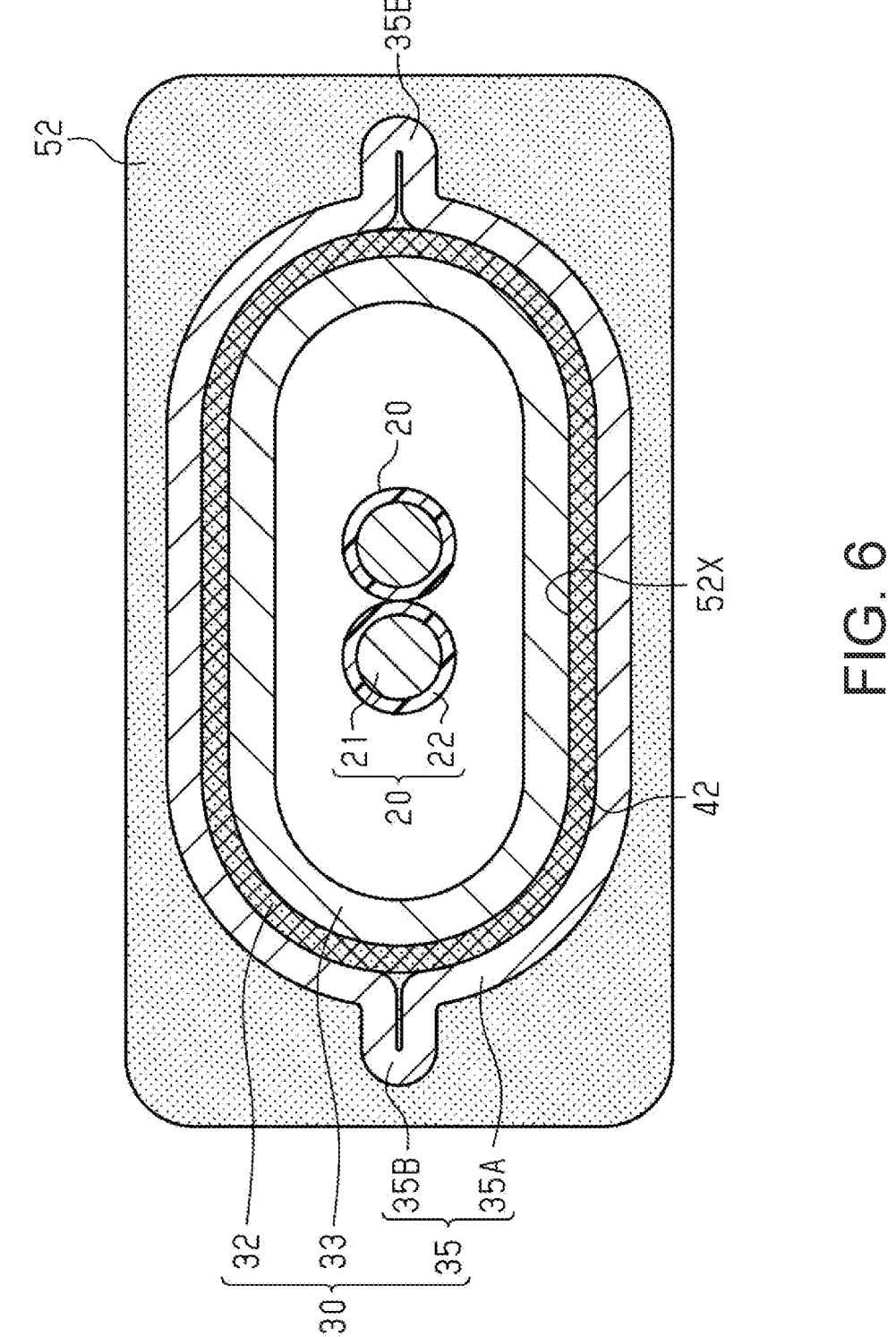
FIG. 6 is a schematic horizontal cross-sectional view of a fixed portion of a shield shell and the electromagnetic shield member in the wire harness in the embodiment.

As shown in FIGS. 5 and 6, each electric wire 20 is a covered electric wire that has a core wire 21 made of a conductor and an insulating covering 22 that surrounds the outer circumference of the core wire 21 and has an electrically insulating property. Each electric wire 20 is a high-voltage electric wire that supports a high voltage and a large current, for example. Each electric wire 20 may be a non-shielded electric wire having no electromagnetic shield structure or may be a shielded electric wire having an electromagnetic shield structure, for example. Each electric wire 20 in the present embodiment is a non-shielded electric wire. FIG. 5 does not show the waterproof member 62.

As the core wire 21, a twisted wire formed by twisting a plurality of metallic elemental wires or a single-core wire made of a single conductor can be used, for example. As the single-core wire, a columnar conductor made of one columnar metallic bar with a solid internal structure or a cylindrical conductor with a hollow internal structure can be used, for example. As the core wire 21, a twisted wire, a columnar conductor, and a cylindrical conductor may be used in combination. As a material of the core wire 21, a copper-based or an aluminum-based metallic material can be used, for example.

The insulating covering 22 covers the entire outer circumferential surface of the core wire 21 in the circumferential direction thereof, for example. The insulating covering 22 is made of a resin material with an insulating property, for example. The cross-sectional shape of each electric wire 20 taken along a plane orthogonal to the lengthwise direction of the electric wires 20, that is, the horizontal cross-sectional shape of each electric wire 20, can be any shape. The horizontal cross-sectional shape of each electric wire 20 can be a circular shape, a semi-circular shape, a polygonal shape, a flat shape, or the like, for example. The horizontal cross-sectional shape of each electric wire 20 in the present embodiment is a circular shape. The term "flat shape" herein includes a rectangular shape, an oblong shape, an oval shape, and the like. The term "oblong shape" herein refers to a rectangular shape with round corners formed by two parallel lines with a substantially equal length and two semi-circles. The "oblong shape" herein has long sides in which the parallel lines extend and short sides that extend in the direction in which the two parallel lines are aligned.

Configuration of Cylindrical Member 31

As shown in FIG. 2, the cylindrical member 31 is formed in an elongated cylindrical shape, for example. The cylindrical member 31 is routed so as to pass outside of the interior of the vehicle V, such as under the floor, for example. The cylindrical member 31 houses the intermediate portions of the electric wires 20 in the lengthwise direction, for example. In other words, the electric wires 20 penetrate through the cylindrical member 31. The cylindrical member 31 collectively surrounds the plurality of electric wires 20. The cylindrical member 31 has the function to protect the electric wires 20 housed therein from flying objects or water droplets, for example. "Collectively surrounding a member A and a member B" herein means that no wall is provided between the member A and the member B, and one cylindrical member surrounds the member A and the member B together, for example.

The cylindrical member 31 is higher in bending rigidity than the electromagnetic shield member 32, for example. The cylindrical member 31 is higher in bending rigidity than the protective member 61, for example. The cylindrical member 31 is harder to bend than the electromagnetic shield member 32 and the protective member 61, for example. The cylindrical member 31 has a rigidity with which the path of the electric wires 20 can be maintained, for example. When mounted in the vehicle V, the cylindrical member 31 has a rigidity to a degree that the straight state or the bent state is not removed due to the vibration or the like of the vehicle V, for example.

The cylindrical member 31 is a shield pipe that is electrically conductive. As the cylindrical member 31, a metallic pipe can be used, for example. As a material of the cylindrical member 31, a copper-based or aluminum-based metallic material can be used, for example. The cylindrical member 31 in the present embodiment is made of an aluminum-based metallic material. The cylindrical member 31 that is a shield pipe has an electromagnetic shield function to suppress radiation of electromagnetic waves from the electric wires 20.

The horizontal cross-sectional shape of the cylindrical member 31 can be any shape. The horizontal cross-sectional shape of the cylindrical member 31 can be a circular shape, a semi-circular shape, a polygonal shape, or a flat shape, for example. As shown in FIG. 5, the horizontal cross-sectional shape of the cylindrical member 31 in the present embodiment is a circular shape. The horizontal cross-sectional shape of the cylindrical member 31 in the present embodiment is a circular cylindrical shape in which the horizontal cross-sectional shape along the inner circumferential surface and the outer circumferential surface is a circular shape.

Configuration of Shield Shell 33

As shown in FIG. 2, the shield shell 33 is provided in the connector C1. The shield shell 33 is attached to a connector housing (not shown) of the connector C1, for example. The shield shell 33 is arranged in the vehicle interior, for example. The shield shell 33 is formed in a cylindrical shape that collectively surrounds the plurality of electric wires 20. The shield shell 33 is higher in bending rigidity than the electromagnetic shield member 32, for example. The shield shell 33 is harder to bend than the electromagnetic shield member 32, for example.

The shield shell 33 is made of a metal, for example. As a material of the shield shell 33, an iron-based or aluminum-based metallic material can be used, for example. The shield shell 33 has an electromagnetic shield function to suppress radiation of electromagnetic waves from the electric wires 20.

The horizontal cross-sectional shape of the shield shell 33 can be any shape. The horizontal cross-sectional shape of the shield shell 33 can be a circular shape, a semi-circular shape, a polygonal shape, or a flat shape, for example. As shown in FIG. 6, the horizontal cross-sectional shape of the shield shell 33 in the present embodiment is an oblong shape. The shield shell 33 in the present embodiment is formed in an oblong cylindrical shape in which the horizontal cross-sectional shape along the inner circumferential surface and the outer circumferential surface is an oblong shape.

Configuration of Electromagnetic Shield Member 32

As shown in FIG. 2, the electromagnetic shield member 32 is formed in an elongated cylindrical shape, for example. The electromagnetic shield member 32 is formed so as to span between the cylindrical member 31 and the shield shell 33 in the lengthwise direction of the electric wires 20, for example. The electromagnetic shield member 32 is formed so as to surround the outer circumference of portions of the plurality of electric wires exposed from the cylindrical member 31 and the shield shell 33, for example. The electromagnetic shield member 32 is formed so as to collectively surround the outer circumference of the plurality of electric wires 20 provided between the cylindrical member 31 and the shield shell 33, for example. The electromagnetic shield member 32 surrounds the entire outer circumference of the electric wires 20 in the circumferential direction thereof, for example. A first end portion of the electromagnetic shield member 32 in the axial direction surrounds the entire outer circumference of the cylindrical member 31 in the circumferential direction thereof. A second end portion of the electromagnetic shield member 32 in the axial direction surrounds the entire outer circumference of the shield shell 33 in the circumferential direction thereof.

The electromagnetic shield member 32 has flexibility, for example. The electromagnetic shield member 32 has more excellent flexibility than the cylindrical member 31, for example. The electromagnetic shield member 32 has more excellent flexibility than the shield shell 33, for example. As the electromagnetic shield member 32, a braided member formed by braiding a plurality of conductive elemental wires or metallic foil can be used, for example. The electromagnetic shield member 32 in the present embodiment is a braided member.

Figure 7:
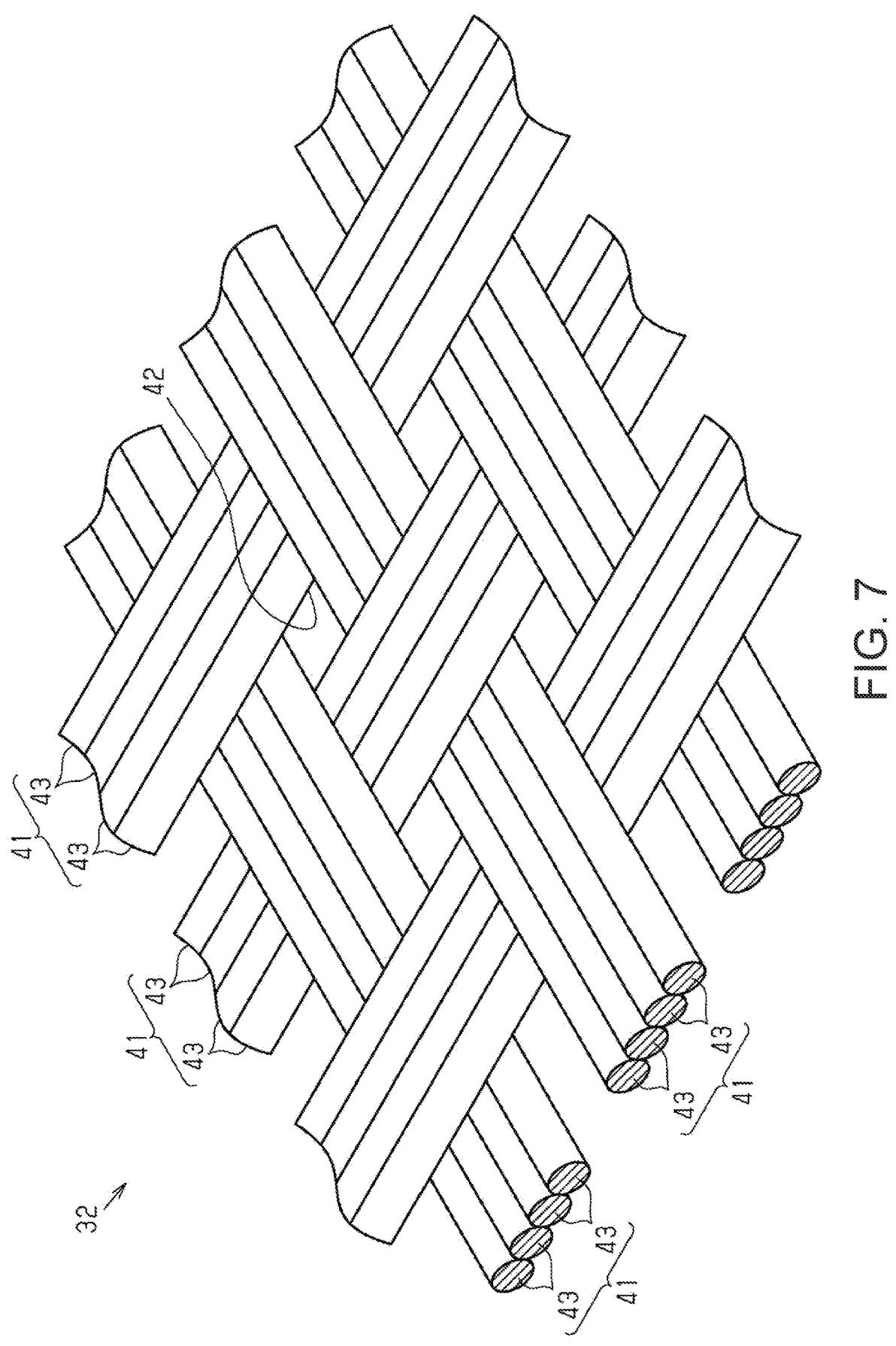
FIG. 7 is a schematic perspective view of the electromagnetic shield member in the embodiment.

As shown in FIG. 7, the electromagnetic shield member 32 has a plurality of elemental wire bundles 41, for example. The electromagnetic shield member 32 is formed by weaving the plurality of elemental wire bundles 41 in the form of a cylinder. The electromagnetic shield member 32 is formed by weaving the plurality of elemental wire bundles 41 in a plain-weave manner, that is, by crossing warp and weft threads so that they are alternatingly placed above and below one another, for example. The electromagnetic shield member 32 has a mesh 42 formed by two elemental wire bundles 41 as warp threads and two elemental wire bundles 41 as weft threads. The method for weaving the elemental wire bundles 41 is not particularly limited. The elemental wire bundles 41 may be woven in a sateen-weave manner or twill-weave manner, for example.

Each elemental wire bundle 41 has a plurality of (four in FIG. 7) metallic elemental wires 43. That is, in the electromagnetic shield member 32, a plurality of metallic elemental wires 43 are one set (pick), that is, one elemental wire bundle 41. As the material of the metallic elemental wires 43, a copper-based or aluminum-based metallic material can be used, for example. The material of the metallic elemental wires 43 may be a metallic material of the same kind as that of the cylindrical member 31, or may be a metallic material of a kind different from that of the cylindrical member 31, for example. The material of the metallic elemental wires 43 in the present embodiment is a copper-based metallic material, which is different from the metallic material of the cylindrical member 31.

Configuration of Fixing Member 34

As shown in FIG. 3, the fixing member 34 fixes the first end portion of the electromagnetic shield member 32 in the axial direction to the outer circumferential surface of the cylindrical member 31 in a state where the first end portion of the electromagnetic shield member 32 is in contact with the outer circumferential surface of the cylindrical member 31. The fixing member 34 is attached to the outer circumferential surface of the first end portion of the electromagnetic shield member 32. The fixing member 34 is fitted to the outside of the cylindrical member 31 in a manner where the first end portion of the electromagnetic shield member 32 is sandwiched between the fixing member 34 and the outer circumferential surface of the cylindrical member 31. The fixing member 34 is formed in an annular shape along the outer circumferential surface of the cylindrical member 31, for example.

As shown in FIG. 5, the fixing member 34 has a main body portion 34A that is formed in an annular shape and a tightened portion 34B that protrudes outward from the main body portion 34A in the radial direction, for example. The main body portion 34A in the present embodiment is formed in a circular ring shape along the outer circumferential surface of the circular cylindrical member 31. The inner circumferential surface of the main body portion 34A is in contact with the outer circumferential surface of the electromagnetic shield member 32. The inner circumferential surface of the main body portion 34A is in areal contact with the outer circumferential surface of the electromagnetic shield member 32 over the entire circumference of the main body portion 34A in the circumferential direction thereof, for example.

The fixing member 34 is tightened toward the inside of the cylindrical member 31 in the radial direction to fix the first end portion of the electromagnetic shield member 32 to the outer circumferential surface of the cylindrical member 31. That is, the fixing member 34, which is a swage ring, is swaged to the outer circumferential surface of the cylindrical member 31 with the first end portion of the electromagnetic shield member 32 sandwiched between the fixing member 34 and the outer circumferential surface of the cylindrical member 31, thereby fixing the first end portion of the electromagnetic shield member 32 to the outer circumferential surface of the cylindrical member 31. More specifically, prior to the swaging, the root portions of the tightened portion 34B of the fixing member 34 are separated from each other. The root portions of the tightened portion 34B are squeezed and deformed so as to come closer to each other in the directions shown by arrows in FIG. 5, whereby the diameter of the main body portion 34A of the fixing member 34 is reduced to fix the first end portion of the electromagnetic shield member 32 to the outer circumferential surface of the cylindrical member 31. Accordingly, the first end portion of the electromagnetic shield member 32 is fixed to the outer circumferential surface of the cylindrical member 31 in a state of being in direct contact with the outer circumferential surface of the cylindrical member 31, and the electromagnetic shield member 32 is electrically and mechanically connected to the cylindrical member 31. After the swaging, the tightened portion 34B has an inner space 34X. The inner space 34X is provided separately from the inner space of the main body portion 34A where the cylindrical member 31 and the electromagnetic shield member 32 are housed, for example.

Configuration of Fixing Member 35

As shown in FIG. 2, the fixing member 35 fixes the second end portion of the electromagnetic shield member 32 in the axial direction to the outer circumferential surface of the shield shell 33 in a state where the second end portion of the electromagnetic shield member 32 is in contact with the outer circumferential surface of the shield shell 33. The fixing member 35 is attached to the outer circumferential surface of the second end portion of the electromagnetic shield member 32. The fixing member 35 is fitted to the outside of the shield shell 33 in a manner where the second end portion of the electromagnetic shield member 32 is sandwiched between the fixing member 35 and the outer circumferential surface of the shield shell 33. The fixing member 35 is formed in an annular shape along the outer circumferential surface of the shield shell 33, for example.

As shown in FIG. 6, the fixing member 35 has a main body portion 35A that is formed in an annular shape and one or more tightened portions 35B that protrude outward from the main body portion 35A in the radial direction, for example. The fixing member 35 in the present embodiment has two tightened portions 35B. The main body portion 35A in the present embodiment is formed in an oblong ring shape along the outer circumferential surface of the oblong circular cylindrical shield shell 33. The inner circumferential surface of the main body portion 35A is in contact with the outer circumferential surface of the electromagnetic shield member 32. The inner circumferential surface of the main body portion 35A is in areal contact with the outer circumferential surface of the electromagnetic shield member 32 over the entire circumference of the main body portion 35A in the circumferential direction thereof, for example. The two tightened portions 35B are provided on the two short sides of the main body portion 35A, for example.

The fixing member 35 is swaged to the outer circumferential surface of the shield shell 33 with the second end portion of the electromagnetic shield member 32 sandwiched between the fixing member 35 and the outer circumferential surface of the shield shell 33, thereby fixing the second end portion of the electromagnetic shield member 32 to the outer circumferential surface of the shield shell 33. For example, the tightened portions 35B are squeezed and deformed, whereby the diameter of the main body portion 35A of the fixing member 35 is reduced to fix the second end portion of the electromagnetic shield member 32 to the outer circumferential surface of the shield shell 33. Accordingly, the second end portion of the electromagnetic shield member 32 is fixed to the outer circumferential surface of the shield shell 33 while in direct contact with the outer circumferential surface of the shield shell 33, and the electromagnetic shield member 32 is electrically and mechanically connected to the shield shell 33.

In this manner, in the wire harness 10 shown in FIG. 2, the cylindrical member 31 and the shield shell 33 are electrically connected together via the electromagnetic shield member 32. Although not shown in the drawings, the shield shell 33 is ground-connected (grounded) to a vehicle body panel or the like. Accordingly, the cylindrical member 31, the electromagnetic shield member 32, and the shield shell 33 are ground-connected.

Configuration of Oxidation Suppression Layer 51)

As shown in FIG. 4, the oxidation suppression layer 51 is formed so as to seal the fixed portion of the electromagnetic shield member 32 and the cylindrical member 31 fixed by the fixing member 34. The oxidation suppression layer 51 seals the fixed portion fixed by the fixing member 34 such that the fixed portion fixed by the fixing member 34 is isolated from the space outside of the oxidation suppression layer 51. The oxidation suppression layer 51 seals the fixed portion fixed by the fixing member 34 to suppress the fixed portion from coming into contact with air (outside air) and suppress oxidation of the electromagnetic shield member 32, the cylindrical member 31, and the fixing member 34 at the fixed portion. The oxidation suppression layer 51 continuously covers the outer circumferential surface of the fixing member 34, the side surface of the fixing member 34, the outer circumferential surface of the electromagnetic shield member 32 exposed from the fixing member 34, and the outer circumferential surface of the cylindrical member 31 exposed from the electromagnetic shield member 32. The side surface of the fixing member 34 herein is an end surface of the fixing member 34 in the axial direction. The oxidation suppression layer 51 is formed so as to extend along the axial direction of the cylindrical member 31, for example. In other words, the lengthwise direction of the oxidation suppression layer 51 extends in parallel to the axial direction of the cylindrical member 31. FIG. 4 shows the plurality of metallic elemental wires 43 in each elemental wire bundle 41 of the electromagnetic shield member 32 as one wire for the simplification of the drawing. FIG. 4 does not show the protective member 61 and the waterproof member 62.

The oxidation suppression layer 51 covers the entire outer circumferential surface of the fixing member 34 in an areal contact state. Specifically, the oxidation suppression layer 51 covers, in an areal contact state, the outer circumferential surface of the fixing member 34 over the entire length of the fixing member 34 in the axial direction. As shown in FIG. 5, the oxidation suppression layer 51 covers, in an areal contact state, the outer circumferential surface of the fixing member 34 in the circumferential direction thereof. The oxidation suppression layer 51 covers the entire outer circumferential surface of the main body portion 34A of the fixing member 34, and covers the entire outer circumferential surface of the tightened portion 34B of the fixing member 34 as well. The oxidation suppression layer 51 covers the entire inner circumferential surface of the tightened portion 34B, for example. The oxidation suppression layer 51 is formed so as to fill the inner space 34X of the tightened portion 34B, for example.

The oxidation suppression layer 51 covers, in an areal contact state, the entire outer circumferential surface of the electromagnetic shield member 32 in the circumferential direction thereof. The oxidation suppression layer 51 covers, in an areal contact state, the entire outer circumferential surface of the cylindrical member 31 in the circumferential direction thereof.

As shown in FIG. 4, the outer circumferential surface of the fixing member 34, the side surface of the fixing member 34, and the outer circumferential surface of the electromagnetic shield member 32 form a first step portion D1 on the outer circumferential surface of the fixed portion fixed by the fixing member 34. The first step portion D1 is provided at both end portions of the fixing member 34 in the axial direction. That is, the outer circumferential surface of the fixed portion fixed by the fixing member 34 has two first step portions D1. The outer circumferential surface of the electromagnetic shield member 32, the axial end surface of the electromagnetic shield member 32, and the outer circumferential surface of the cylindrical member 31 form a second step portion D2 on the outer circumferential surface of the fixed portion fixed by the fixing member 34. The second step portion D2 is formed so as to be continuous with one of the two first step portions D1. The second step portion D2 is provided at the terminal of the first end portion of the electromagnetic shield member 32 in the axial direction, for example.

The oxidation suppression layer 51 is formed so as to continuously cover the outer circumferential surface of the fixing member 34, the two first step portions D1, and the second step portion D2, for example. The oxidation suppression layer 51 covers the outer circumferential surface of the electromagnetic shield member 32 that is located outside relative to both end portions of the fixing member 34 in the axial direction of the fixing member 34, for example. The oxidation suppression layer 51 covers the outer circumferential surface of the cylindrical member 31 that is exposed from the mesh 42 of the electromagnetic shield member 32 provided at a position not overlapping the fixing member 34 in the radial direction of the cylindrical member 31, for example. The oxidation suppression layer 51 is formed so as to fill the mesh 42 of the electromagnetic shield member 32 that is provided at a position not overlapping the fixing member 34 in the radial direction of the cylindrical member 31, for example.

The oxidation suppression layer 51 covers the entire inner circumferential surface of the fixing member 34, for example. The oxidation suppression layer 51 covers the inner circumferential surface of the fixing member 34 over the entire length of the fixing member 34 in the axial direction, for example. The oxidation suppression layer 51 covers the entire inner circumferential surface of the fixing member 34 in the circumferential direction thereof, for example. The oxidation suppression layer 51 covers the outer circumferential surface of the cylindrical member 31 exposed from the mesh 42 of the electromagnetic shield member 32 at a portion in contact with the inner circumferential surface of the fixing member 34, for example. The oxidation suppression layer 51 is formed so as to fill the mesh 42 of the electromagnetic shield member 32 at a portion in contact with the inner circumferential surface of the fixing member 34, for example. That is, the oxidation suppression layer 51 is formed so as to fill the mesh 42 of the electromagnetic shield member 32 at the portion sandwiched between the inner circumferential surface of the fixing member 34 and the outer circumferential surface of the cylindrical member 31. The oxidation suppression layer 51 is formed so as to fill the gap between the inner circumferential surface of the fixing member 34 and the outer circumferential surface of the cylindrical member 31.

As shown in FIGS. 3 and 5, the oxidation suppression layer 51 is formed in a cylindrical shape as a whole, for example. The oxidation suppression layer 51 has a through hole 51X through which the cylindrical member 31 passes. The through hole 51X is formed so as to penetrate through the oxidation suppression layer 51 in the lengthwise direction. The shape of the through hole 51X as seen from the lengthwise direction of the oxidation suppression layer 51 is a shape along the outer circumferential surface of the cylindrical member 31. As shown in FIG. 5, the shape of the through hole 51X as seen from the lengthwise direction of the oxidation suppression layer 51 is a circular shape.

The horizontal cross-sectional shape of the oxidation suppression layer 51 along the outer circumferential surface can be any shape. The horizontal cross-sectional shape of the oxidation suppression layer 51 can be a circular shape, a polygonal shape, or a flat shape, for example. The horizontal cross-sectional shape of the oxidation suppression layer 51 is different from the shape of the fixing member 34 along the outer circumferential surface, for example. The horizontal cross-sectional shape of the oxidation suppression layer 51 in the present embodiment is a rectangular shape. The horizontal cross-sectional shape of the oxidation suppression layer 51 in the present embodiment is a rectangular shape of a size that can encompass the entire fixing member 34. The oxidation suppression layer 51 has a different thickness at each part in the circumferential direction of the oxidation suppression layer 51, for example.

As shown in FIG. 4, the outer circumferential dimension of the oxidation suppression layer 51 is constant over the entire length in the lengthwise direction of the oxidation suppression layer 51. The oxidation suppression layer 51 has a different thickness at each part in the lengthwise direction of the oxidation suppression layer 51, for example. For example, a thickness T1 of a part of the oxidation suppression layer 51 covering the outer circumferential surface of the fixing member 34 is smaller than a thickness T2 of a part of the oxidation suppression layer 51 covering the outer circumferential surface of the electromagnetic shield member 32 exposed from the fixing member 34. For example, the thickness T2 of the oxidation suppression layer 51 is larger than a thickness T3 of a part of the oxidation suppression layer 51 covering the outer circumferential surface of the cylindrical member 31 exposed from the fixing member 34 and the electromagnetic shield member 32.

The oxidation suppression layer 51 can be formed by setting the fixed portion fixed by the fixing member 34 in a molding die, pouring a curable material such as a silicone sealing material into the molding die, and then solidifying the curable material, for example.

Configuration of Oxidation Suppression Layer 52

As shown in FIG. 2, the oxidation suppression layer 52 is formed so as to seal the fixed portion of the electromagnetic shield member 32 and the shield shell 33 fixed by the fixing member 35. The oxidation suppression layer 52 seals the fixed portion fixed by the fixing member 35 such that the fixed portion fixed by the fixing member 35 is isolated from the space outside of the oxidation suppression layer 52. The oxidation suppression layer 52 seals the fixed portion fixed by the fixing member 35 to suppress the fixed portion from coming into contact with air (outside air) and suppress oxidation of the electromagnetic shield member 32, the shield shell 33, and the fixing member 35 at the fixed portion. The oxidation suppression layer 52 continuously covers the outer circumferential surface of the fixing member 35, the side surface of the fixing member 35, the outer circumferential surface of the electromagnetic shield member 32 exposed from the fixing member 35, and the outer circumferential surface of the shield shell 33 exposed from the electromagnetic shield member 32. The side surface of the fixing member 35 is the end surface of the fixing member 35 in the axial direction. The oxidation suppression layer 52 is formed so as to extend along the axial direction of the shield shell 33, for example. In other words, the lengthwise direction of the oxidation suppression layer 52 extends in parallel to the axial direction of the shield shell 33.

The oxidation suppression layer 52 covers the entire outer circumferential surface of the fixing member 35 in an areal contact state. Specifically, the oxidation suppression layer 52 covers, in an areal contact state, the outer circumferential surface of the fixing member 35 over the entire length of the fixing member 35 in the axial direction. As shown in FIG. 6, the oxidation suppression layer 52 covers, in an areal contact state, the entire outer circumferential surface of the fixing member 35 in the circumferential direction thereof. The oxidation suppression layer 52 covers the entire outer circumferential surface of the main body portion 35A of the fixing member 35 in the circumferential direction thereof and covers the entire outer circumferential surface of the tightened portion 35B of the fixing member 35.

The oxidation suppression layer 52 covers, in an areal contact state, the entire outer circumferential surface of the electromagnetic shield member 32 in the circumferential direction thereof. The oxidation suppression layer 52 covers, in an areal contact state, the entire outer circumferential surface of the shield shell 33 in the circumferential direction thereof.

The oxidation suppression layer 52 is formed in a cylindrical shape as a whole, for example. The oxidation suppression layer 52 has a through hole 52X through which the shield shell 33 passes. The through hole 52X is formed so as to penetrate through the oxidation suppression layer 52 in the lengthwise direction. The shape of the through hole 52X as seen from the lengthwise direction of the oxidation suppression layer 52 is the shape of the shield shell 33 along the outer circumferential surface. The shape of the through hole 52X as seen from the lengthwise direction of the oxidation suppression layer 52 is an oblong shape.

The horizontal cross-sectional shape of the oxidation suppression layer 52 along the outer circumferential surface can be any shape. The horizontal cross-sectional shape of the oxidation suppression layer 52 can be a circular shape, a polygonal shape, or a flat shape, for example. The horizontal cross-sectional shape of the oxidation suppression layer 52 is different from the shape of the fixing member 35 along the outer circumferential surface, for example. The horizontal cross-sectional shape of the oxidation suppression layer 52 in the present embodiment is a rectangular shape. The horizontal cross-sectional shape of the oxidation suppression layer 52 in the present embodiment is a rectangular shape of a size that can encompass the entire fixing member 35. The oxidation suppression layer 52 has a different thickness at each part of the oxidation suppression layer 52 in the circumferential direction, for example. The outer circumferential dimension of the oxidation suppression layer 52 is constant over the entire length in the lengthwise direction.

The oxidation suppression layer 52 can be formed by setting the fixed portion fixed by the fixing member 35 in a molding die, pouring a curable material such as a silicone sealing material into the molding die, and then solidifying the curable material, for example.

Configuration of Protective Member 61

As shown in FIG. 3, the protective member 61 is separated from the cylindrical member 31 in the lengthwise direction of the electric wires 20, for example. The protective member 61 is provided so as to surround the outer circumference of the electric wires 20 drawn out from the cylindrical member 31, for example. The protective member 61 is provided so as to surround the outer circumference of the electromagnetic shield member 32, for example. As shown in FIG. 2, the protective member 61 is provided at a position between the cylindrical member 31 and the connector C1 in the lengthwise direction of the electric wires 20, for example. The protective member 61 is a corrugated tube made of resin, for example. The protective member 61 has more excellent flexibility than the cylindrical member 31, for example.

Configuration of Waterproof Member 62

The waterproof member 62 can be a contractive tube or a rubber tube, for example. The material of the contractive tube can be a synthetic resin having a polyolefin-based resin such as cross-linked polyethylene or cross-linked polypropylene as the main ingredient, for example. Examples of the rubber tube include nitrile rubber, silicone rubber, urethane rubber, acryl rubber, butyl rubber, and ethylene propylene rubber. The waterproof member 62 in the present embodiment is a rubber tube.

As shown in FIG. 3, the waterproof member 62 is provided to span between the cylindrical member 31 and the protective member 61, for example. The waterproof member 62 is provided so as to span between the outer circumference of the cylindrical member 31 exposed from the oxidation suppression layer 51 and the outer circumference of the end portion of the protective member 61 in the axial direction, for example. The waterproof member 62 is formed so as to surround the outer circumference of the oxidation suppression layer 51.

The waterproof member 62 has a cylindrical main body portion 63 (main body) that surrounds the outer circumference of the oxidation suppression layer 51, a first cylindrical connection portion 64 (first cylindrical connection) that is connected to a first end portion of the cylindrical main body portion 63 in the axial direction, and a second cylindrical connection portion 65 that is connected to a second end portion of the cylindrical main body portion 63 in the axial direction, for example. The first cylindrical connection portion 64 is connected to the outer circumferential surface of the cylindrical member 31. The second cylindrical connection portion 65 is connected to the outer circumferential surface of the protective member 61. The waterproof member 62 is a single component in which the first cylindrical connection portion 64, the cylindrical main body portion 63, and the second cylindrical connection portion 65 are continuously formed in one piece, for example. The cylindrical main body portion 63, the first cylindrical connection portion 64, and the second cylindrical connection portion 65 in the present embodiment have a circumferential wall that is continuous over the entire circumference, and is formed in an endless structure in which the start point and the end point coincide with each other. In other words, the cylindrical main body portion 63, the first cylindrical connection portion 64, and the second cylindrical connection portion 65 in the present embodiment have no slit extending along the axial direction of the waterproof member 62.

The cylindrical main body portion 63 is formed in a cylindrical shape of a size that can house the oxidation suppression layer 51. The cylindrical main body portion 63 is formed so as to surround the entire outer circumference of the oxidation suppression layer 51 in the circumferential direction. The inner circumferential surface of the cylindrical main body portion 63 is formed in a shape corresponding to the outer circumferential surface of the oxidation suppression layer 51, for example. The inner circumferential surface of the cylindrical main body portion 63 is not in contact with the outer circumferential surface of the oxidation suppression layer 51, for example. In other words, a gap is provided between the inner circumferential surface of the cylindrical main body portion 63 and the outer circumferential surface of the oxidation suppression layer 51. The inner circumferential dimension of the central portion of the cylindrical main body portion 63 is larger than the outer circumferential dimension of the oxidation suppression layer 51, for example.

The inner circumferential dimension of the first end portion of the cylindrical main body portion 63 in the axial direction is formed so as to be smaller with increasing proximity to the first cylindrical connection portion 64. The first end portion of the cylindrical main body portion 63 has a portion of which the inner circumferential dimension is smaller than the outer circumferential dimension of the oxidation suppression layer 51, for example. The inner circumferential surface of the first end portion of the cylindrical main body portion 63 is capable of engagement with the side surface of the oxidation suppression layer 51 in the axial direction of the waterproof member 62, for example. The inner circumferential dimension of the second end portion of the cylindrical main body portion 63 in the axial direction is formed so as to be smaller with increasing proximity to the second cylindrical connection portion 65. The second end portion of the cylindrical main body portion 63 has a portion with an inner circumferential dimension that is smaller than the outer circumferential dimension of the oxidation suppression layer 51, for example. The inner circumferential surface of the second end portion of the cylindrical main body portion 63 is capable of engagement with the side surface of the oxidation suppression layer 51 in the axial direction of the waterproof member 62, for example.

The first cylindrical connection portion 64 is formed in a cylindrical shape of a size that can fit to the outer circumference of the cylindrical member 31. The first cylindrical connection portion 64 in the present embodiment is formed in a circular cylindrical shape. The inner circumferential dimension of the first cylindrical connection portion 64 is smaller than the inner circumferential dimension of the cylindrical main body portion 63, for example. The inner circumferential dimension of the first cylindrical connection portion 64 is smaller than the outer circumferential dimension of the oxidation suppression layer 51, for example. The first cylindrical connection portion 64 is formed so as to be capable of engagement with the side surface of the oxidation suppression layer 51 in the axial direction of the waterproof member 62, for example.

The fixing member 71 is provided on the outer circumferential surface of the first cylindrical connection portion 64. The first cylindrical connection portion 64 is tightened inward in the radial direction by the fixing member 71 and is fixed to the outer circumferential surface of the cylindrical member 31. For example, the first cylindrical connection portion 64 is tightened by the fixing member 71 until the first cylindrical connection portion 64 comes into areal contact in a liquid-tight manner with the outer circumferential surface of the cylindrical member 31. Accordingly, it is possible to suppress intrusion of a liquid such as water into the inside of the waterproof member 62 from between the first cylindrical connection portion 64 and the cylindrical member 31.

The second cylindrical connection portion 65 is formed in a cylindrical shape of a size that can fit to the outer circumference of the protective member 61. The second cylindrical connection portion 65 in the present embodiment is formed in a circular cylindrical shape. The inner circumferential dimension of the second cylindrical connection portion 65 is smaller than the inner circumferential dimension of the cylindrical main body portion 63, for example. The inner circumferential dimension of the second cylindrical connection portion 65 is smaller than the outer circumferential dimension of the oxidation suppression layer 51, for example. The second cylindrical connection portion 65 is formed so as to be capable of engagement with the side surface of the oxidation suppression layer 51 in the axial direction of the waterproof member 62, for example.

The fixing member 72 is provided on the outer circumferential surface of the second cylindrical connection portion 65. The second cylindrical connection portion 65 is tightened inward in the radial direction by the fixing member 72 and is fixed to the outer circumferential surface of the protective member 61. For example, the second cylindrical connection portion 65 is tightened by the fixing member 72 until the second cylindrical connection portion 65 comes into areal contact in a liquid-tight manner with the outer circumferential surface of the protective member 61. Accordingly, it is possible to suppress the intrusion of a liquid such as water into the inside of the waterproof member 62 from between the second cylindrical connection portion 65 and the protective member 61.

The structure of the vicinity of the connector C1 in the wire harness 10 has been described with reference to FIGS.

2 to 7. Although not shown, the structure of the vicinity of the connector C2 (see FIG. 1) in the wire harness 10 is similar to the structure of the vicinity of the connector C1.

Next, operations and effects of the present embodiment will be described.

(1) The wire harness 10 includes the electric wires 20, the conductive cylindrical member 31 through which the electric wires 20 penetrate, and the cylindrical electromagnetic shield member 32 that surrounds the outer circumference of the electric wires 20 and is fixed to the end portion of the cylindrical member 31. The wire harness 10 includes the annular fixing member 34 that fixes the electromagnetic shield member 32 to the end portion of the cylindrical member 31, and the oxidation suppression layer 51 that seals the fixed portion of the cylindrical member 31 and the electromagnetic shield member 32 fixed by the fixing member 34.

With this configuration, the fixed portion of the cylindrical member 31 and the electromagnetic shield member 32 fixed by the fixing member 34 is sealed by the oxidation suppression layer 51. Accordingly, it is possible to suppress the cylindrical member 31 and the electromagnetic shield member 32 at the fixed portion from coming into contact with air, and it is possible to suppress oxidation of the cylindrical member 31 and the electromagnetic shield member 32 at the fixed portion. As a result, it is possible to suppress an increase in the electric resistance value of the electrically connected portion between the cylindrical member 31 and the electromagnetic shield member 32, and it is possible to suppress a decrease in the electromagnetic shield performance of the wire harness 10.

(2) It is also possible to suppress intrusion of a liquid such as water into the inside of the oxidation suppression layer 51. Thus, even if the cylindrical member 31, the electromagnetic shield member 32, and the fixing member 34 are made of different conductive materials, it is possible to preferably suppress the occurrence of electrical corrosion (bimetallic corrosion) among the cylindrical member 31, the electromagnetic shield member 32, and the fixing member 34. Therefore, it is possible to increase the degree of freedom in selecting the materials of the cylindrical member 31, the electromagnetic shield member 32, and the fixing member 34.

(3) The oxidation suppression layer 51 is formed so as to extend over the fixing member 34, the electromagnetic shield member 32, and the cylindrical member 31 and so as to continuously cover the outer circumferential surface of the fixing member 34, the outer circumferential surface of the electromagnetic shield member 32, and the outer circumferential surface of the cylindrical member 31. Accordingly, it is possible to preferably suppress the cylindrical member 31 and the electromagnetic shield member 32 at the fixed portion fixed by the fixing member 34 from coming into contact with air, and it is possible to preferably suppress oxidation of the cylindrical member 31 and the electromagnetic shield member 32 at the fixed portion. As a result, it is possible to suppress an increase in the electric resistance value of the electrically connected portion between the cylindrical member 31 and the electromagnetic shield member 32, and it is possible to suppress a decrease in the electromagnetic shield performance of the wire harness 10.

(4) The oxidation suppression layer 51 has a heat resistance of 120° C. or higher. Accordingly, even if the wire harness 10 is subjected to a high-temperature environment of about 100° C. to 115° C. at a heat cycle test or the like, it is possible to preferably suppress the deterioration of the oxidation suppression layer 51. For example, even if the wire harness 10 is subjected to a high-temperature environment, it is possible to preferably suppress deformation and melting of the oxidation suppression layer 51. Accordingly, even if the wire harness 10 is subjected to a high-temperature environment, the state of the fixed portion of the fixing member 34 sealed by the oxidation suppression layer 51 can be maintained, and it is possible to preferably suppress oxidation of the cylindrical member 31 and the electromagnetic shield member 32 at the fixed portion.

(5) The oxidation suppression layer 51 is made of a silicone sealing material with excellent heat resistance. Accordingly, if the wire harness 10 is subjected to a high-temperature environment, it is possible to preferably suppress deformation or melting of the oxidation suppression layer 51.

(6) The electromagnetic shield member 32 is a braided member that is formed by braiding the plurality of conductive elemental wires 43 and has the mesh 42. The oxidation suppression layer 51 is formed so as to cover the entire inner circumferential surface of the fixing member 34. The oxidation suppression layer 51 is also formed so as to fill the mesh 42 in the electromagnetic shield member 32 at a portion in contact with the inner circumferential surface of the fixing member 34. Accordingly, it is possible to form the oxidation suppression layer 51 so as to fill a gap between the inner circumferential surface of the fixing member 34 and the outer circumferential surface of the cylindrical member 31. Therefore, it is possible to suppress intrusion of foreign matter into the gap between the inner circumferential surface of the fixing member 34 and the outer circumferential surface of the cylindrical member 31, and it is possible to suppress generation of an unintended product in the gap between the inner circumferential surface of the fixing member 34 and the outer circumferential surface of the cylindrical member 31. Therefore, it is possible to suppress an increase in the electric resistance value of the electrically connected portion between the cylindrical member 31 and the electromagnetic shield member 32 due to foreign matter or an unintended product, and it is possible to suppress a decrease in the electromagnetic shield performance of the wire harness 10.

(7) On the outer circumferential surface of the fixed portion at which the electromagnetic shield member 32 is fixed by the fixing member 34 to the outer circumferential surface of the cylindrical member 31, the first step portions D1 are formed by the outer circumferential surface of the fixing member 34, the side surface of the fixing member 34, and the outer circumferential surface of the electromagnetic shield member 32. On the outer circumferential surface of the fixed portion fixed by the fixing member 34, the second step portion D2 is formed by the outer circumferential surface of the electromagnetic shield member 32 and the outer circumferential surface of the cylindrical member 31. In contrast to this, in the wire harness 10 of the present embodiment, the outer circumferential dimension of the oxidation suppression layer 51 is constant over the entire length of the oxidation suppression layer in the lengthwise direction. This eliminates steps corresponding to the first step portions D1 and the second step portion D2 from the outer circumferential surface of the oxidation suppression layer 51.

(8) The thickness T2 of the oxidation suppression layer 51 at the portion covering the outer circumferential surface of the electromagnetic shield member 32 exposed from the fixing member 34 is larger than the thickness T1 of the oxidation suppression layer 51 at the portion covering the outer circumferential surface of the fixing member 34.

Accordingly, it is possible to improve the cushioning property of the oxidation suppression layer 51 at the portion that covers the outer circumferential surface of the electromagnetic shield member 32 exposed from the fixing member 34, and it is possible to improve the protection performance of the oxidation suppression layer 51 at that portion.

(9) The cylindrical waterproof member 62 attached to the outside of the oxidation suppression layer 51 has the cylindrical main body portion 63 that surrounds the entire outer circumference of the oxidation suppression layer 51 in the circumferential direction and the first cylindrical connection portion 64 that is formed continuously in one piece with the cylindrical main body portion 63 and is connected to the outer circumferential surface of the cylindrical member 31. The inner circumferential dimension of the cylindrical main body portion 63 is greater than or equal to the outer circumferential dimension of the oxidation suppression layer 51. The inner circumferential dimension of the first cylindrical connection portion 64 is smaller than the outer circumferential dimension of the oxidation suppression layer 51. Accordingly, in the axial direction of the waterproof member 62, the oxidation suppression layer 51 and the first cylindrical connection portion 64 can engage with each other. Therefore, when attaching the waterproof member 62 to the cylindrical member 31 and the oxidation suppression layer 51, the waterproof member 62 can be easily positioned with respect to the oxidation suppression layer 51.

Other Embodiments

The foregoing embodiments can be carried out in a modified manner as described below. The foregoing embodiments and the following modified examples can be combined with each other as long as there is no technical discrepancy.

The structures of the oxidation suppression layers 51 and 52 in the foregoing embodiments can be changed as appropriate. For example, the structure of the oxidation suppression layer 51 can be changed as appropriate as long as the oxidation suppression layer 51 can seal the fixed portion of the cylindrical member 31 and the electromagnetic shield member 32 fixed by the fixing member 34. For example, the structure of the oxidation suppression layer 52 can be changed as appropriate as long as the oxidation suppression layer 52 can seal the fixed portion of the shield shell 33 and the electromagnetic shield member 32 fixed by the fixing member 35.

Figure 8:
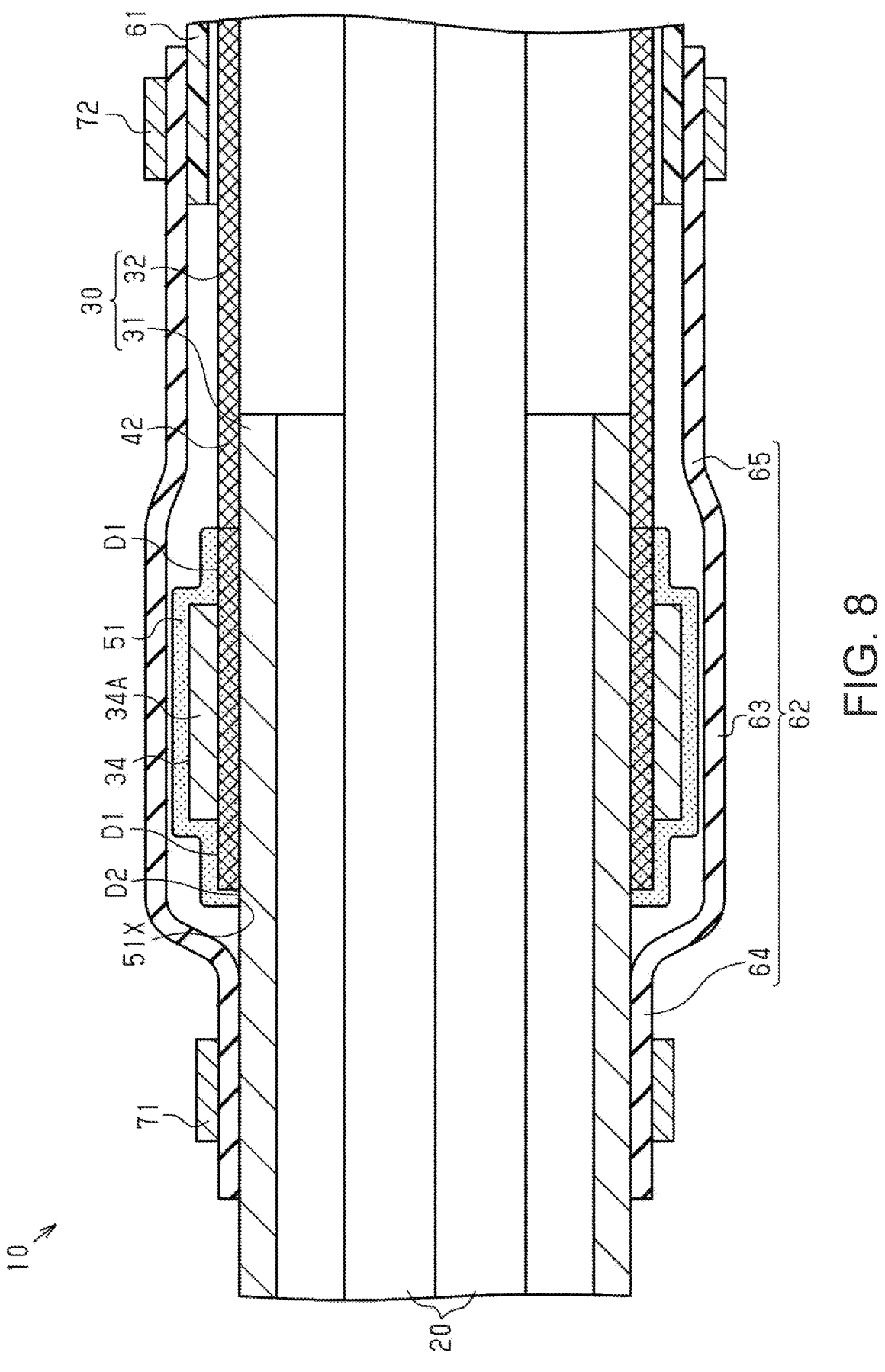
FIG. 8 is a schematic vertical cross-sectional view of a wire harness in a modified example.

As shown in FIG. 8, for example, the outer circumferential surface of the oxidation suppression layer 51 may be formed in a stepped shape along the first step portions D1 and the second step portion D2. On the outer circumferential surface of the oxidation suppression layer 51 in the present modified example, steps are formed at portions corresponding to the first step portions D1 and at a portion corresponding to the second step portion D2. The thickness of the oxidation suppression layer 51 in the present modified example is constant over the entire length of the oxidation suppression layer 51 in the lengthwise direction. The oxidation suppression layer 51 can be formed by applying a curable material such as a silicone sealing material to the fixed portion fixed by the fixing member 34 and solidifying the curable material, for example. The structure of the oxidation suppression layer 52 can be changed as with the oxidation suppression layer 51 shown in FIG. 8.

With this configuration, the outer circumferential surface of the oxidation suppression layer 51 is formed in a stepped shape along the first step portions D1 and the second step portion D2. This decreases the number of partially thick portions of the oxidation suppression layer 51, as compared to the case where the outer circumferential surface of the oxidation suppression layer 51 is formed in a non-stepped shape so as to absorb the steps resulting from the first step portions D1 and the second step portion D2, that is, as compared to the case where the outer circumferential dimension of the oxidation suppression layer 51 is constant over the entire length of the oxidation suppression layer 51 in the lengthwise direction. This makes it possible to reduce the volume of the oxidation suppression layer 51. As a result, it is possible to reduce the material cost of the oxidation suppression layer 51.

In the foregoing embodiments, a cylindrical waterproof member may be provided surrounding the outer circumference of the oxidation suppression layer 52. In this case, the waterproof member can have the same structure as the waterproof member 62, for example.

Any of the oxidation suppression layer 51 and 52 in the foregoing embodiments may be omitted. The protective member 61 in the foregoing embodiments may be omitted.

The waterproof member 62 in the foregoing embodiments may be omitted. In the foregoing embodiments, the materials of the cylindrical member 31, the electromagnetic shield member 32, and the shield shell 33 are not particularly limited. For example, the materials of the cylindrical member 31, the electromagnetic shield member 32, and the shield shell 33 can be changed as appropriate as long as these materials are conductive materials that can perform an electromagnetic shield function.

As the cylindrical member 31 in the foregoing embodiments, for example, a shield pipe having a structure in which a conductive shield layer is stacked on the outer circumferential surface of a pipe main body made of a non-metallic material (for example, a resin material) may be used, or a shield pipe having a structure in which a resin layer is further stacked on the outer circumferential surface of the shield layer may be used. In the case of the latter shield pipe, the electromagnetic shield member 32 is connected to the seal layer that is exposed by stripping a portion of the outer resin layer.

The cylindrical member 31 may be omitted from the electromagnetic shield component 30 in the foregoing embodiments and the part that was covered with the cylindrical member 31 may be covered with the electromagnetic shield member 32. In this case, out of the oxidation suppression layers 51 and 52, the oxidation suppression layer 51 is omitted.

In the foregoing embodiments, the electromagnetic shield member 32 is embodied as a braided member. However, the present disclosure is not limited to this. For example, the electromagnetic shield member 32 may be embodied as metallic foil. In the foregoing embodiment, there were two electric wires 20 constituting the wire harness 10, but the present disclosure is not limited to this. The number of the electric wires 20 can be changed in accordance with the specifications of the vehicle V. For example, the number of the electric wires 20 may be one or three or more. For example, the electric wires 20 constituting the wire harness 10 may additionally include a low-voltage electric wire for connecting a low-voltage battery and various low-voltage devices (for example, a lamp and a car audio device).

In the foregoing embodiments, the plurality of in-vehicle devices electrically connected by the wire harness 10 are embodied as the high-voltage battery M1 and the inverter M2. However, the present disclosure is not limited to this. The plurality of in-vehicle devices electrically connected by the wire harness 10 are not particularly limited as long as they are electric devices to be mounted in the vehicle V.

The arrangement relationship between the high-voltage battery M1 and the inverter M2 in the vehicle V is not limited to that of the foregoing embodiments, and may be changed as appropriate in accordance with the configuration of the vehicle V. The embodiments disclosed herein should be regarded as being illustrative and non-limiting in all respects. The scope of the present disclosure is indicated not by the above description but by the scope of the claims, and is intended to encompass all modifications within the meaning and scope equivalent to the scope of the claims.

What is claimed is:

1. A wire harness comprising:
an electric wire;
a conductive cylindrical tube through which the electric wire penetrates;
a cylindrical electromagnetic shield that surrounds an outer circumference of the electric wire and is fixed to an end of the cylindrical tube;
an annular fixing member that fixes the electromagnetic shield to the end of the cylindrical tube; and
an oxidation suppression layer that seals a fixed portion of the cylindrical tube and the electromagnetic shield fixed by the fixing member,
wherein an outer circumferential surface of the oxidation suppression layer is formed in a stepped shape along a first step that is formed by an outer circumferential surface of the fixing member, a side surface of the fixing member, and an outer circumferential surface of the electromagnetic shield, and along a second step that is formed by the outer circumferential surface of the electromagnetic shield and an outer circumferential surface of the cylindrical tube.

2. The wire harness according to claim 1, wherein the oxidation suppression layer continuously covers:
the entire outer circumferential surface of the fixing member,
the side surface of the fixing member,
the entire outer circumferential surface of the electromagnetic shield not covered by the fixing member in the fixed portion, and
the entire outer circumferential surface of the cylindrical tube not covered by the electromagnetic shield in the fixed portion.

3. The wire harness according to claim 1, wherein the oxidation suppression layer has a heat resistance of 120° C. or higher.

4. The wire harness according to claim 3, wherein the oxidation suppression layer is made of a silicone sealing material.

5. The wire harness according to claim 1, wherein:
the electromagnetic shield is a braided member that is formed by braiding a plurality of conductive elemental wires and has a mesh,
the oxidation suppression layer covers an entire inner circumferential surface of the fixing member, and
the oxidation suppression layer fills the mesh of the electromagnetic shield at a portion in contact with the inner circumferential surface of the fixing member.

6. The wire harness according to claim 1, wherein:
the oxidation suppression layer extends along an axial direction of the cylindrical tube, and
an outer circumferential dimension of the first step of the oxidation suppression layer is constant over an entire length of the first step of the oxidation suppression layer.

7. The wire harness according to claim 6, wherein a thickness of the oxidation suppression layer at a portion covering the outer circumferential surface of the electromagnetic shield not covered by the fixing member is larger than a thickness of the oxidation suppression layer at a portion covering the outer circumferential surface of the fixing member.

8. The wire harness according to claim 6, further comprising:

a cylindrical waterproof tube that surrounds an outer circumference of the oxidation suppression layer, wherein:

the waterproof tube has a cylindrical main body that surrounds the entire outer circumference of the oxidation suppression layer and a first cylindrical connection that is formed continuously in one piece with the cylindrical main body and is connected to an outer circumferential surface of the cylindrical tube, an inner circumferential dimension of the cylindrical main body is greater than or equal to the outer circumferential dimension of the oxidation suppression layer, and an inner circumferential dimension of the first cylindrical connection is smaller than the outer circumferential dimension of the oxidation suppression layer.

\* \* \* \* \*